US008277671B2

(12) United States Patent
Everson et al.

(10) Patent No.: US 8,277,671 B2
(45) Date of Patent: Oct. 2, 2012

(54) POLISHING PROCESS FOR PRODUCING DAMAGE FREE SURFACES ON SEMI-INSULATING SILICON CARBIDE WAFERS

(75) Inventors: William J. Everson, State College, PA (US); David Snyder, State College, PA (US); Richard Gamble, State College, PA (US); Volker D. Heydemann, State College, PA (US)

(73) Assignee: The Penn State Research Foundation, University Park, PA (US)

( * ) Notice: Subject to any disclaimer, the term of this patent is extended or adjusted under 35 U.S.C. 154(b) by 721 days.

(21) Appl. No.: 11/856,810

(22) Filed: Sep. 18, 2007

(65) Prior Publication Data

US 2009/0215268 A1    Aug. 27, 2009

Related U.S. Application Data

(63) Continuation of application No. 11/271,737, filed on Nov. 14, 2005, now abandoned.

(60) Provisional application No. 60/629,409, filed on Nov. 19, 2004.

(51) Int. Cl.
*B44C 1/22* (2006.01)
*C03C 15/00* (2006.01)
*H01L 21/302* (2006.01)
*H01L 21/461* (2006.01)

(52) U.S. Cl. ............... 216/52; 216/53; 216/88; 216/89; 438/691; 438/692; 438/693

(58) Field of Classification Search ............ 216/52, 216/53, 88, 89; 438/690, 691, 692, 693; 252/79.1; 257/E21.23; 451/28, 41
See application file for complete search history.

(56) References Cited

U.S. PATENT DOCUMENTS

| | | | | | |
|---|---|---|---|---|---|
| 3,916,584 | A | * | 11/1975 | Howard et al. | 51/308 |
| 4,166,787 | A | * | 9/1979 | Blanton et al. | 208/120.35 |
| 4,956,015 | A | * | 9/1990 | Okajima et al. | 106/3 |
| 5,119,540 | A | * | 6/1992 | Kong et al. | 118/730 |
| 5,149,338 | A | | 9/1992 | Fulton | |
| 5,300,130 | A | * | 4/1994 | Rostoker | 51/309 |
| 5,584,898 | A | * | 12/1996 | Fulton | 51/309 |

(Continued)

FOREIGN PATENT DOCUMENTS

JP    2001205555 A  *  7/2001

(Continued)

OTHER PUBLICATIONS

Everson, W.J.; Snyder, D.W.; Heydemann, V.D. Polishing and Surface Characterization of SiC Substrates. Materials Science Forum vols. 338-342. pp. 837-840. Trans Tech Publications, Switzerland, 2000.*

(Continued)

*Primary Examiner* — Parviz Hassanzadeh
*Assistant Examiner* — Margaret D Klunk
(74) *Attorney, Agent, or Firm* — Gifford, Krass, Sprinkle, Anderson & Citkowski, P.C.

(57) ABSTRACT

A polishing mixture and related method of polishing a material wafer surface, such as silicon carbide, are disclosed. The polishing mixture comprises; an abrasive and an oxidizer mixed in an acidic solution. Alumina may be used as the abrasive and the polishing mixture may have a pH less than or equal to seven (7).

4 Claims, 9 Drawing Sheets

U.S. PATENT DOCUMENTS

| | | | |
|---|---|---|---|
| 5,750,434 | A | 5/1998 | Urushidani et al. |
| 5,770,095 | A | 6/1998 | Sasaki et al. |
| 5,895,583 | A | 4/1999 | Augustine et al. |
| 6,835,120 | B1 * | 12/2004 | Matsui .................. 451/41 |
| 2002/0106900 | A1 | 8/2002 | Vogt et al. |
| 2003/0124850 | A1 * | 7/2003 | Minamihaba et al. ........ 438/689 |
| 2003/0139069 | A1 * | 7/2003 | Block et al. .................. 438/962 |
| 2003/0157804 | A1 | 8/2003 | Puppe et al. |
| 2004/0065022 | A1 * | 4/2004 | Machii et al. .................. 51/309 |
| 2005/0056810 | A1 | 3/2005 | Bian et al. |
| 2005/0211950 | A1 | 9/2005 | De Rege Thesauro et al. |
| 2005/0282390 | A1 | 12/2005 | Bian et al. |
| 2006/0108325 | A1 | 5/2006 | Everson et al. |
| 2008/0261401 | A1 * | 10/2008 | Kerr et al. .................. 438/693 |

FOREIGN PATENT DOCUMENTS

WO    WO 2005/099388 A2    10/2005

OTHER PUBLICATIONS

Zhu, Zhize; Muratov, Viktor; Fischer, Traugott. Tribochemical polishing of silicon carbide in oxidant solution. WEAR pp. 848-856, year 1999.*

Gabouze et al. "Chemical etching investigation of polycrystalline p-type 6H-SiC in HF/Na2O2 solutions" Applied Surface Science 255 (2009) 6751-6756.*

"Hydrogen Peroxide Technical Data Sheet" Solvay Chemicals 2006 available from www.solvaychemicals.us.*

Zhou, L. et al., "Chemomechanical polishing of silicon carbide", J. Electrochem. Soc., Jun. 1997, pp. L161-L163, 144-6, The Electrochemical Society, Inc., Pennington, N.J.

* cited by examiner

POLISHING PROCESS FOR PRODUCING DAMAGE FREE SURFACES ON SEMI-INSULATING SILICON CARBIDE WAFERS

CROSS-REFERENCE TO RELATED APPLICATIONS

This application is a continuation of U.S. patent application Ser. No. 11/271,737 filed Nov. 14, 2005, which claims priority of U.S. Provisional Application No. 60/629,409 filed Nov. 19, 2004.

STATEMENT OF GOVERNMENT RIGHTS

Work related to the invention was done in performance of Government Contract No. DAAD19-02-1-0231. The government has certain rights in the invention.

COLOR DRAWINGS

The patent or application file contains at least one drawing executed in color. Copies of this patent or patent application with color drawings will be provided by the Office upon request and payment of the necessary fee.

BACKGROUND OF THE INVENTION

1. Field of the Invention

Embodiments of the invention relate generally to surface treatments, such as those adapted for use in the polishing of a material surface useful in the fabrication of semiconductor devices.

2. Description of Related Art

Silicon carbide (SiC) is used extensively as a semiconductor material for many applications. Semiconductor devices formed on a SiC substrate have the ability to operate at higher voltages and temperatures than conventional devices formed on a silicon (Si) substrate. Indeed, for many high frequency, high temperature, high voltage, and/or hostile radiation environment applications, SiC is rapidly becoming the semiconductor material of choice.

SiC may be grown in many different polytypes, but 6H and 4H polytypes are widely used in industry. The "H" in these polytype designations refers to a hexagonal crystal structure, and the "4" or "6" denotes the number of steps before replication of the structure. Polytypes may be oriented "on" or "off" a primary crystal axis.

Regardless of polytype, SiC may be doped with elements that increase or decrease its resistivity. When SiC resistivity reaches levels greater than about $10^5$ ohm-cm, it is considered semi-insulating. However, one current industry trend seeks to produce intrinsically pure semi-insulating SiC material which is not doped. The most common commercially available wafer types are 4H— and 6H—SiC, both conductive and semi-insulating, as well as on axis and up to 8° off axis. Wafers formed from SiC are used as substrates supporting the fabrication of semiconductor devices.

The performance qualities exhibited by semiconductor devices formed on a SiC substrate are greatly influenced by the structural integrity and smoothness of epitaxial films grown on the substrate. A smooth, defect-free surface is crucial to the epitaxial growth of high-quality thin films. Numerous studies of epitaxially grown thin films on 4H— and 6H—SiC substrate have shown that fabrication process induced defects in the substrate surface, such as scratches and/or subsurface damage introduced during lapping and polishing processes, are primary contributors to unwanted polytype inclusions in the subsequently grown epitaxial films.

Unfortunately, the material properties of SiC that provide its desirable characteristics also present difficult challenges to putative surface treatment techniques. For example, SiC is extremely hard, possessing a Mohs hardness of nine plus ($9^+$). It is very chemically stable, and generally unaffected by exposure to acid or alkali at temperatures less than about 300° C.

Conventional surface treatments applied to SiC may be generally categorized as mechanical polishing, chemical-mechanical polishing (CMP), and etching. Mechanical polishing techniques are characterized by the use of very hard abrasives, such as diamond grit, applied to the surface of a SiC wafer. While mechanical polishing effectively removes surface material, it often results in a rough and/or damaged wafer surface. Conventional etching techniques applied to SiC wafers are performed at high temperature, and while potentially useful in the localized planarization of the wafer surface are ill-suited to global planarization objectives.

As a result of the deficiencies noted in mechanical polishing and etching techniques, significant research has been directed to improving CMP techniques. CMP techniques generally combine mechanical polishing with chemical etching to provide a wafer surface having decreased overall roughness and less damage to subsurface layers. In a recent technical paper, one conventional CMP method was proposed wherein a concentrated colloidal silica slurry having high pH (e.g., a pH higher than 10) was applied at elevated temperatures (e.g., 55° C.) to the Si-terminated surface of a SiC wafer. See, I. Electrochem. Soc. Vol. 144, No. 6, June 1997, the subject matter of which is hereby incorporated by reference. Similarly, in patent document WO 2005/099388 A2, the subject matter of which is hereby incorporated by reference, another conventional CMP method was proposed wherein a high pH (e.g., 8 to 14) solution containing colloidal silica or alumina was used to polish an SI wafer.

Due to the hardness of SiC, multiple surface treatments or surface treatment cycles are often applied before an acceptable surface is obtained. Mechanical polishing using diamond grit remains the industry standard, at least in the early stages (or cycles) of SiC surface treatment. Typical practice involves the slicing of SiC wafers from a crystalline boule using a wire saw having a fixed diamond abrasive or a wire carrying a mixture of diamond and boron carbide grits in a slurry solution. To remove the wafer surface damage resulting from the cutting process, SiC wafers are fixed to a platen and then lapped and polished with a succession of smaller size diamond grits on a conventional polishing machine. This is typically a 4-step process beginning with a 3-micron diamond grit, moving to a 1-micron diamond grit, and then to a 0.25-micron diamond grit. The final polishing step is often a conventional CMP process using colloidal silica.

However, as will be seen in some additional detail by way of comparison to embodiments of the invention, conventional surface treatment techniques simply do not work well—particularly when applied to wide-bandgap material such as SiC. Among other deficiencies apparent in conventional surface treatment techniques, selective etching of scratches and other surface defects may actually increase the overall roughness of a wafer surface. That is, conventional surface treatment techniques often remove equal amounts of material from the working wafer surface and scratches and other defects present in the working surface. Thus, scratches and surface defects are merely propagated down into the wafer surface by the conventional surface treatments. Worse still, some conventional surface treatments selectively etch the scratches and surface defects to a greater degree than the working wafer surface, thereby deepening and/or expanding the scratch or defect.

A non-selective—relative to scratches and other surface defects formed in a wafer surface—surface treatment process is needed. At a minimum, the non-selective process should work on all major polytypes of SiC, including at least 6H and 4H polytypes, whether the SiC wafer is formed off-axis and on-axis, and whether the SiC wafer is conductive or semi-insulating in nature.

SUMMARY OF THE INVENTION

Embodiments on the invention provide a non-selective surface treatment well adapted to the polishing of material wafer surfaces, such as SiC wafers.

In one embodiment, the invention provides a process adapted to the treatment of a material surface comprising; polishing the surface using a polishing mixture, the polishing mixture comprising; an abrasive and an oxidizer mixed in an acidic solution having a pH equal to or less than 7.

In another embodiment, the invention provides a polishing mixture having a pH equal to or less than 7 and comprising; an abrasive and an oxidizer mixed with an acid and a solvent.

In yet another embodiment, the invention provides a process of fabricating a semiconductor device comprising; polishing a surface of a material wafer using a polishing mixture and thereafter growing an epitaxial layer on the substrate, wherein the polishing mixture is non-selective relative to scratches in the material wafer, has a pH of 7 or less, and generally comprises one or more abrasives and an oxidizer.

BRIEF DESCRIPTION OF THE DRAWINGS

Several embodiments of the invention are described with reference to the attached color images. These images are identified as "figures" within the description and are variously generated by well understood and conventionally interpreted imaging techniques, including Tunneling Electron Microscopy (TEM), Atomic Force Microscopy (AFM), Photon Back-Scattering (PBS) measurements, and ZYGO Light Interferometery (ZYGO).

DETAILED DESCRIPTION OF THE PREFERRED EMBODIMENTS

Figure 1A:
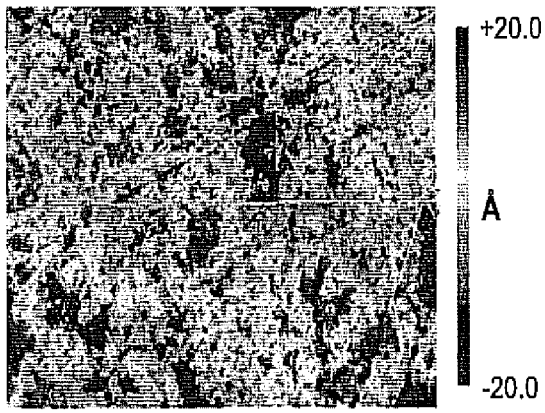
FIGS. 1A through 1D are related ZYGO images illustrating wafer surface characteristics through a sequence of polishing cycles using one embodiment of the invention.

Embodiments of the invention will now be described. These embodiments are presented as teaching examples. The actual scope of the invention is not limited to only these examples, but is defined by the attached claims.

In one aspect, embodiments of the invention address the issue of errant polishing selectivity noted above with respect to conventional polishing techniques. That is, embodiments of the invention address the inadequacies associated with the etching selectivity of conventional surface treatment techniques in which scratches and other surface defects are etched to an equal or greater extent than the working surface of a wafer. In this context, the term "etch[ing]" is used to generically describe any process removing material from any portion of the working surface of a wafer. The term "working surface" generally identifies a major wafer surface being treated or polished. Scratches and other surface defects are generally characterized by surface profiles having a vertical depth different from a desired plane for the working surface.

In the context of conventional polishing techniques and equipment, within which embodiments of the invention may be readily incorporated, the axis through which force is applied to a wafer being polished is termed the "vertical" axis. An axis normal to the vertical axis is termed a "lateral" axis. Using this terminology convention, a scratch may be said to have vertical depth into the working surface of a wafer and lateral width across the plane of the working surface. These terms are, however, merely relative orientations and conveniently drawn to current polishing techniques and equipment. Embodiments of the invention are not limited by such descriptions of relative orientation (e.g., vertical versus lateral).

The results of errant etching selectivity associated with, for example, conventional polishing techniques using colloidal silica will be further highlighted for comparative purposes in the description that follows. Exemplary embodiments of the invention were applied to semi-insulating SiC wafers to produce relatively defect-free working surfaces with respect to conventional outcomes. The improved chemical-mechanical polishing (CMP) process provided by embodiments of the invention has been developed such that it may be easily incorporated into existing fabrication lines (e.g., used with commercially available consumables and equipment, as well as collaterally related techniques).

Throughout this description, the term "improved polishing process" is used to generally denote a surface treatment, or part of a surface treatment, incorporating one or more embodiments of the invention. The term "improved polishing process" also distinguishes conventional polishing process (es). The term "improved surface" is used to refer to a working surface, such as one adapted for use as a semiconductor substrate, that has been treated using the improved polishing process.

In one embodiment, the invention provides an improved polishing process characterized by the provision and/or use of a polishing mixture comprising an abrasive, an oxidizer, and an acid within a solvent. The general combination of acid and solvent may be replaced by the term "acidic solution" since at least some embodiments of the invention provide acid in sufficient quantity to reduce the pH of the polishing mixture to below seven (7), or alternatively below five (5). Acetic acid has been successfully used in one embodiment to effectively lower the polishing mixture pH, but other acids or acidic solutions may used for this purpose.

In another embodiment of the invention the foregoing polishing mixture is applied to the working surface of a material wafer.

The abrasive in the foregoing polishing mixture may comprise alumina. The abrasive may be formed from a single abrasive or a mixture of two or more abrasives. In one embodiment of the invention, the abrasive has a hardness less than that of the material being polished.

By way of comparison, conventional CMP processes commonly use a polishing mixture having a much higher pH, typically at least a pH of ten (10). This high pH level is used to oxidize the working surface of the wafer being polished. To increase the material removal rate, hard abrasives, such as diamond may be applied to the conventional colloidal silica CMP processes to remove the resulting oxide layer.

Embodiments of the improved polishing process are non-selective relative to scratches and other defects in the working surface of a wafer, as compared with conventional CMP processes. Thus, scratches are removed at a rate equal to or greater than the general rate of material removal for other portions of the working surface. This is true for applications of the improved polishing process to 6H— and 4H—SiC wafers—both doped and un-doped, as well as on-axis and off axis in nature. The rate of material removal provided by the improved polishing process is generally greater than or equal to that provided by conventional CMP processes, such as those using colloidal silica. Thus, substantially defect-free wafer surfaces may be obtained by use of the improved polishing process with reduced consumables and polishing time. Hence, the improved polishing process provides cost and time advantages over the conventional CMP processes.

This non-selective quality of the improved polishing process may be further characterized in one embodiment of the invention as providing a relatively higher rate of material removal in the direction of the vertical axis of the wafer surface (i.e., the direction normal to the working surface of the wafer) than in any lateral direction across the wafer surface. As a result, scratches and other surface defects are removed. In contrast, conventional CMP processes have a relatively low vertical rate of material removal and a relatively high lateral rate of material removal, and therefore tend to broaden and/or deepen scratches and other defects present in a wafer surface.

Specific test examples, including exemplary applications of both conventional CMP and improved polishing processes, are described below with reference to Tables 1, 2, and 3. Each of the test examples was performed using a commercially available SiC wafer. A single type of test material was selected for comparative purposes, and SiC is a convenient, practical choice for testing.

The improved polishing process may, however, be applied to wafers formed from materials other than SiC. For example, the improved polishing process may be used to treat a material surface comprising one or more materials including a conducting material, an insulating material, a dielectric or a semi-conducting material selected from a group of materials including a metal, an oxide, a glass, an alloy, a carbide, a nitride, diamond, a silicide, a chromide, ferride, a boride, a sulfide, a phosphide, silicon nitride, silicon nitride, aluminum nitride, gallium nitride, alumina-gallium nitride, indium-gallium nitride, Safire, Indium phosphide, boron nitride, silicon, and silica, as well as and any reasonable combination of such.

In at least one embodiment of the invention, the improved polishing process finds particularly useful application in the surface treatment of wide band gap semiconductor material(s) such as those commonly used as a substrate adapted to the formation of active semiconductor devices and layers.

After polishing each test example, the wafer surface was variously imaged and/or evaluated using one or more of the following: Tunneling Electron Microscopy (TEM), Atomic Force Microscopy (AFM), ZYGO White Light Interferometery (ZYGO), optical micrographs, and/or Photon Back-Scattering (PBS) measurements. Additionally, for some test examples, the growth of a gallium nitride (GaN) layer on the polished wafer surface was used to further characterize the material properties of the wafer. From the foregoing, average roughness (Ra), root mean square roughness (Rq), and peak-to-valley roughness (PV) for each polished wafer surface was determined.

Of note, evaluation of some test examples suggests that defect densities for wafer surfaces polished using the improved polishing process can be equal to the intrinsic defect densities expected for native SiC. Further, the improved polishing process did not increase subsurface damage or the amount of dislocations present in the test example materials.

Table 1 below summaries various polishing mixtures and process conditions associated with selected test examples. Test example number (or run number) is indicated in the first column of Table 1. Of note, test example "0" corresponds to a conventional CMP process using colloidal silica.

For each test example following test example "0", a polishing mixture solution ratio is given in the second column of Table 1. Where colloidal silica is used in the polishing mixture, its mixture ratio with water (i.e., the common solvent used the polishing mixtures applied to the test example) is given. In test examples run using a polishing mixture without colloidal silica, the entry in column 2 is left empty (–). Next, in the third column, an abrasive additional to colloidal silica, where used, is identified along with its volume concentration as a percentage of the polishing mixture (Conc.). Thereafter, in the fifth column, an oxidizer, if used, is identified along with its volume concentration as a percentage of the final polishing mixture.

The seventh column of Table 1 indicates a rotational speed for a polishing platen in revolutions per minute (RPM) during the test example. The eighth column of Table 1 indicates the vertical force applied to the test example wafer during the polishing process. The ninth column indicates a polishing run time for the test example.

An initial roughness value (Ra-start—expressed in Angstroms (Å)), indicating an average roughness of the wafer surface before polishing is given next in column ten of Table 1. For comparison, an average roughness value for each test example after polishing is also given Ra-final) in the eleventh column of Table 1. Finally, an average rate of material removal (MRR) is expressed for each test example in μm of material per hour in the last column of Table 1.

TABLE 1

| Run # | SiO2 0.06 um H$_2$O | Abrasive Size/Type | Conc | Oxidizer | Conc | RPM | Force (PSI) | Run time (Hrs) | Ra (start) (Å) | Ra (final) (Å) | MRR (um/hr) |
|---|---|---|---|---|---|---|---|---|---|---|---|
| 0  | 1/1   | 0.06 um SiO2      | —    | SiO2  | —   | 140 | 5 | 8  | 7.5   | 44.5  | 0.06  |
| 1  | 1/1   | 1 um Al2O3        | 50%  | —     | —   | 140 | 5 | 8  | 10.1  | 50.0  | 0.25  |
| 2  | 1/1   | 1 um Al2O3        | 50%  | —     | —   | 140 | 5 | 8  | 8.8   | 40.13 | 0.16  |
| 3  | 1/1   | 2 um ZrO2         | 50%  | —     | —   | 140 | 5 | 8  | 9.9   | 42.8  | 0.00  |
| 4  | —     | 0.5 um diamond    | 100% | —     | —   | 120 | 5 | 5  | Sawed | 6.8   | 4.90  |
| 5  | —     | 0.1 um diamond    | 100% | —     | —   | 70  | 5 | 5  | 7.2   | 7.6   | 0.60  |
| 6  | —     | 0.1 um diamond    | 100% | —     | —   | 20  | 5 | 8  | 8.1   | 7.3   | 0.25  |
| 7  | 1/1   | 0.1 um diamond    | 25%  | —     | —   | 120 | 5 | 4  | 6.8   | 15.4  | 0.94  |
| 8  | 1/1   | 0.1 um diamond    | 10%  | —     | —   | 120 | 5 | 8  | 4.5   | 17.6  | 0.56  |
| 9  | 1/1   | 0.1 um diamond    | 25%  | —     | —   | 20  | 5 | 10 | 7.9   | 10.1  | 0.20  |
| 10 | 1/1   | 0.1 um diamond    | 10%  | —     | —   | 20  | 5 | 10 | 7.5   | 5.5   | 0.60  |
| 11 | 1/1   | 0.1 um diamond    | 10%  | —     | —   | 20  | 5 | 6  | 7.7   | 14.6  | 0.50  |
| 12 | 1/1   | 0.05 um diamond   | 50%  | —     | —   | 120 | 5 | 8  | 7.6   | 38.7  | 0.06  |
| 13 | 1/1   | 0.05 um diamond   | 50%  | —     | —   | 20  | 5 | 8  | 7.2   | 11.6  | 0.025 |
| 14 | 1/1   | 0.05 um diamond   | 25%  | —     | —   | 120 | 5 | 8  | 7.6   | 19.8  | 0.06  |
| 15 | 1/1   | 0.05 um diamond   | 25%  | —     | —   | 20  | 5 | 8  | 82    | 10.2  | 0.00  |
| 16 | 1/1   | —                 | —    | NaOCl | 50% | 120 | 5 | 6  | 7.5   | 28.9  | 0.125 |
| 17 | 1/1   | —                 | —    | NaOCl | 25% | 120 | 5 | 6  | 8.9   | 29.5  | 0.061 |
| 18 | 1/1   | —                 | —    | NaOCl | 10% | 20  | 5 | 6  | 5.2   | 17.1  | 0.073 |
| 19 | 1/1   | —                 | —    | H2O2  | 50% | 120 | 5 | 6  | 5.8   | 78.9  | 0.043 |
| 20 | 1/1   | —                 | —    | H2O2  | 25% | 20  | 5 | 6  | 7.1   | 14.8  | 0.050 |
| 21 | 1/1   | —                 | —    | H2O2  | 3%  | 20  | 5 | 6  | 9.1   | 17.2  | 0.045 |
| 22 | 1/1   | 0.1 um diamond    | 10%  | NaOCl | 10% | 20  | 5 | 8  | 6.5   | 5.2   | 0.92  |
| 23 | 1/1   | 0.1 um diamond    | 10%  | H2O2  | 5%  | 20  | 5 | 6  | 11.9  | 63.0  | 0.062 |
| 24 | 90/0% | —                 | —    | NaOCl | 10% | 20  | 5 | 6  | 7.5   | 15.5  | 0.11  |
| 25 | 80/0% | 0.1 um diamond    | 10%  | H2O2  | 10% | 20  | 5 | 6  | 7.6   | 12.6  | 0.17  |
| 26 | 80/0% | 0.1 um diamond    | 10%  | NaOCl | 10% | 20  | 5 | 8  | 7.3   | 20.39 | 0.25  |
| 27 | 1/1   | 0.05 um diamond   | 10%  | NaOCl | 10% | 20  | 5 | 6  | 7.5   | 25.5  | 0.125 |

As may be seen from Table 1, only test examples 4, 6, 10, and 22 result in only marginal improvement in the average roughness of the respective wafer surface. Further, many of the test examples result in very low rates of material removal (MRR).

Based on the test examples contained in Table 1, additional test examples were investigated. Results from these additional test examples are summarized in Table 2. In Table 2, a conventional CMP process using 0.06 um colloidal silica (CS), as applied to a SiC wafer surface, is identified as a baseline. Then, various oxidizer, abrasive, and oxidizer-plus-abrasive enhancements are made to the baseline process. Relative rates of material removal (MMR) are indicated, as are relative effects on final wafer surface roughness Ra-final). Finally, an "etched roughness" value (Ra-etched) is given for each variation. Etched roughness is determined by conventional molten KOH testing for assessing subsurface damage associated with the polished wafer surface.

Clearly, certain enhancements to the conventional CMP process involving some combinations of an oxidizer, colloidal silica, and various additional abrasive(s) provide dramatic improvements in the MMR and final roughness (Ra-final) of the wafer surface.

The addition of an oxidizer alone to the conventional colloidal silica based CMP process resulted in only a small increase in MRR and increased surface roughness. Such enhancements also resulted in selective material removal relative to surface damage present in the wafer surface.

The addition of abrasive particles alone, wherein the particles are softer than SiC but harder than $SiO_2$, resulted generally in no change to the MRR, increased surface roughness, and selective material relative to surface damage.

However, the addition of low concentrations of nano-diamond particles (near 0.1 μm) resulted in a higher MRR (e.g., a 10× increase over baseline), low average surface roughness, and reduced selectivity of material removal in damaged surface regions. The combination of 0.1 μm diamond with an oxidizer further increased MRR by 50% (e.g., a 15× increase over baseline), low average surface roughness Ra, and reduced selectivity of material removal in damaged surface regions.

In the test examples noted in Table 1, when alumina abrasive particles were used in a polishing mixture having a pH greater than seven (7), selective etching was observed. However, by reducing the pH to seven (7) or below, such as to approximately five (5), and adding an oxidizer, improved polishing results were obtained over the conventional CMP process. This was particularly true in embodiments of the invention where the alumina comprised a "mixed phase alumina slurry" including, for example, a mixture of corundum and AlOOH or boehmite. In contrast, where a standard alumina abrasive comprising primarily alpha alumina (or corundum) is used the polishing results are not equivalent to those obtained using the mixed phase alumina slurry. This result suggests in some embodiments of the invention that AlOOH may be acting as a chemical component and increasing the rate of surface oxidation thereby increasing removal rate and reducing selectivity.

Summarizing the results of Table 2, oxidizer-enhanced polishing processes provide lower MRR and relatively high surface roughness. Further, decorated subsurface damage was noted. Abrasive-enhanced polishing processes provide higher MRR, relatively high surface roughness, and continued decorated subsurface damage. Oxidizer/diamond abrasive-enhanced polishing processes provide much higher MRR, relatively low surface roughness, and reduced subsurface damage. However, it does not produce damage free surfaces as demonstrated by TEM observations and may only be useful as a precursor to the improved polishing process.

TABLE 2

| Process | MRR [μm/h] | versus baseline | Ra final [Å] | versus baseline | Ra etched [Å] | versus Ra final |
|---|---|---|---|---|---|---|
| Baseline CMP = 0.06 μm colloidal silica (CS) | 0.060 | 1x | 68.3 | 1x | 70.3 | +2.9% |
| Oxidizer-enhanced CMP | | | | | | |
| CS + NaOCl | 0.125 | 2.1x | 17.1 | 4.0x | — | |
| CS + H$_2$O$_2$ | 0.050 | 0.83x | 14.8 | 4.6x | — | |
| Abrasive-enhanced CMP | | | | | | |
| CS + alumina | 0.250 | 4.2x | 40.1 | 1.7x | 42.6 | +6.2% |
| CS + zirconia | 0.160 | 2.7x | 42.7 | 1.6x | 39.4 | −7.7% |
| CS + 0.05 μm diamond | 0.063 | 1.1x | 10.2 | 6.7x | — | |
| CS + 0.1 μm diamond | 0.060 | 1.0x | 5.5 | 12.4x | — | |
| (Oxidizer + Abrasive)-enhanced CMP | | | | | | |
| CS + 0.1 μm diamond + NaOCl (for 6H SiC) | 0.92 | 15x | 5.2 | 13.1x | 5.6 | +7.7% |
| CS + 0.1 μm diamond + NaOCl (for 4H SiC) | 0.55 | 9.2x | 5.3 | 12.9x | 13.6 | +157% |

Table 3 below contains still further test example results variously illustrating improvements and adaptations consistent with one or more embodiments of the invention. The test examples shown in Table 3 are generally characterized by the use of alumina (A$_2$O$_3$) as an abrasive. For example, test example run #28 was 40% solvent (e.g., water), 40% abrasive, and 20% oxidizer by volume. Of note, the polishing mixtures obtained by the test examples shown in Table 3 each possessed a pH of five (5) or less, and therefore did not require the addition of any acid. This, however, may not be true for all possible variations of an improved polishing mixture consistent with one or more embodiments of the invention. Where desired or needful, the pH of the improved polishing mixture may be modified through the addition of acid. For example, acetic acid may be added in small quantities to reduce the pH of the improved polishing mixture to around five (5). The test examples shown in Table 3 resulted in dramatically reduced surface roughness.

two specific embodiments above was colloidal, and included a combination of boehmite and corundum.

The polishing mixture was introduced into the perforated pad using a conventional spray system and worked into the pad for about 5 minutes with a ceramic ring to ensure even distribution of the slurry throughout the pad.

Then test example wafers were respectively applied to the pad with a downward vertical force to a pressure of about 7 psi with the polishing machine running at a speed of about 60 RPM. The introducing spray system was adjusted to provide about 1 ml of polishing mixture every 60 seconds. An initial polishing run cycle time was established at two hours. Test example wafer surfaces were inspected at the end of two hour cycles using a ZYGO white light interferometer and surface roughness was determined.

Typical initial wafer surface roughness following a conventional diamond-polishing process was measured at around 7 Å Ra. Following a first polishing cycle using the

TABLE 3

| Run # | H$_2$O | Abrasive Size/Type | Conc | Oxidizer | Conc | RPM | Force (PSI) | Run time (Hrs) | Ra (start) (Å) | Ra (final) (Å) | MRR (um/hr) |
|---|---|---|---|---|---|---|---|---|---|---|---|
| 28 | 0/40% | Al$_2$O$_3$ 200A 0.1 um diamond-10% | 40% | H2O2 | 20% | 60 | 5 | 8 | 16.5 | 3.0 | 0.300 |
| 29 | 0/40% | Al$_2$O$_3$ 200A 0.1 um diamond-10% | 40% | H2O2 | 20% | 60 | 5 | 8 | 6.6 | 4.3 | 0.150 |
| 30 | 0/40% | Al$_2$O$_3$ 200A 0.1 um diamond-10% | 40% | H2O2 | 20% | 60 | 5 | 12 | 7.4 | 4.0 | 0.300 |
| 31 | 0/45% | Al$_2$O$_3$ 200A | 45% | H2O2 | 10% | 60 | 5 | 10 | 7.0 | 2.5 | 0.400 |
| 32 | 0/45% | Al$_2$O$_3$ 200A | 45% | H2O2 | 10% | 60 | 5 | 10 | 8 | 2.7 | 0.200 |
| 33 | 0/47.5% | Al$_2$O$_3$ 200A | 47.5% | H2O2 | 5% | 60 | 5 | 9 | 7 | 2.5 | 0.200 |
| 34 | 0/47.5% | Al$_2$O$_3$ 200A | 47.5% | H2O2 | 5% | 60 | 5 | 10 | 12.0 | 2.5 | 0.150 |

One specific embodiment of the invention provides a polishing mixture comprising 180 ml of 200 Å alumina, 180 ml of de-ionized water, and 40 ml of 30% hydrogen peroxide. Another specific embodiment of the invention provides a polishing mixture comprising 150 ml of 200 Å alumina, 150 ml of de-ionized water, and 150 ml of 30% hydrogen peroxide.

Each of these specific embodiments was prepared by mixing the ingredients using a magnetic stirrer for approximately 20 minutes. Acid was not added to these specific embodiments.

The polishing mixture was then applied to a perforated polishing pad (e.g., a Rodel IC 1000 perforated pad) that had been conditioned with a diamond-conditioning ring for about 10 minutes before use. The alumina abrasive used in these improved polishing process, such as either one of the two specific embodiments noted above, surface roughness was measured at around 4 Å Ra. Some scratches remain visible following the first cycle of the improved polishing process. Additional cycles of the improved polishing process were performed until the test example wafer surfaces were generally free from scratches and possessed a surface roughness below 3 Å Ra.

In general, rates of material removal for the improved polishing process varied between 100 and 300 nm per cycle. Cycle times may be decreased as the scratches are removed. Also more frequent inspections of the wafer surface may be required as the wafer nears the end of its polishing process. During the wafer polishing process, it is important that the edges of the wafers be regularly inspected to ensure that they maintain their initial chamfer. Any portion of the wafer breaking away from the edge will seriously impact its surface finish.

The improved polishing process may be applied in a manner consistent with the techniques described in U.S. Pat. No. 5,584,898, the subject matter of which is hereby incorporated by reference. That is, a polishing mixture consistent with one or more embodiments of the invention may find ready application within the system proposed by U.S. Pat. No. 5,584, 898.

The attached figures contain color images illustrating the results of various embodiments of the invention as applied to SiC wafers. The illustrated results are only exemplary, but serve to dramatically distinguish results obtained from conventional CMP processes.

For example, FIGS. 1A through 1D are ZYGO images sequentially illustrating one test example as it passes through four (4) cycles of the improved polishing process according to one embodiment of the invention. FIGS. 1A through 1D correspond to test example #31 shown in Table 3.

Figure 1B:
Figure 1C:
Figure 1D:
Figure 2A:
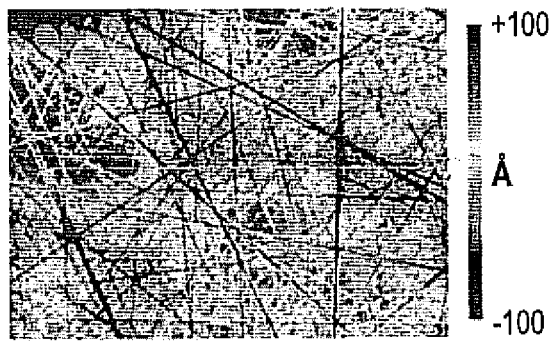
FIGS. 2a through 2D are related ZYGO images illustrating wafer surface characteristics through a sequence of polishing cycles using a conventional CMP technique.
Figure 2B:
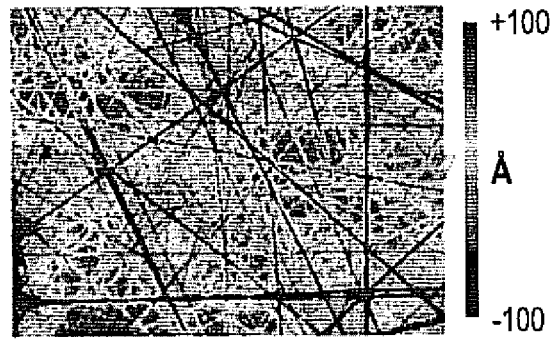
Figure 2C:
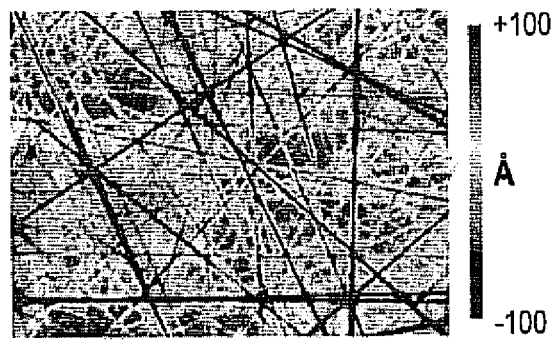
Figure 2D:
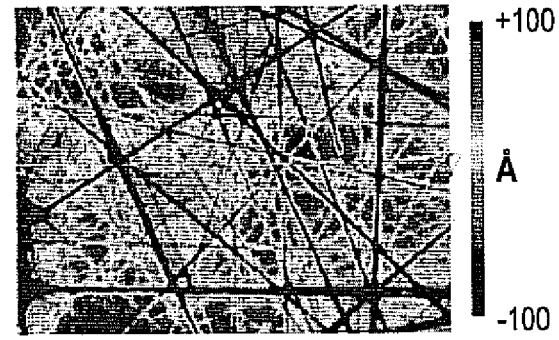

FIG. 1A shows an initial wafer surface following completion of a conventional diamond polishing process. This wafer surface has an average roughness of 7.01 Å Ra, and peak-to-valley roughness of 66.4 Å PV. However, following the first improved polishing process cycle and as shown in FIG. 1B, the average roughness has been reduced to 4.42 Å Ra, and the peak-to-valley roughness has been reduced to 58.8 Å PV. Selective material removal was not observed. Subsequent to the second and third improved polishing process cycles and as shown in FIG. 1C, the average roughness of the wafer surface has been reduced to 2.79 Å Ra. Finally, following a fourth improved polishing process cycle and as shown in FIG. 1D, a final average roughness of 2.56 Å Ra, and a final peak-to-valley roughness of 46.5 Å PV were obtained. As may be readily seen from this sequence of images, the deep scratches and surface defects so apparent in FIGS. 1A and 1B are all but removed following the fourth improved polishing process cycle.

In contrast, FIGS. 2A through 2D are ZYGO images obtained sequentially during a four (4) cycle application of a conventional CMP method using colloidal silica as an abrasive and having a pH higher than 11. These images clearly show selective material removal from portions of the wafer surface around the scratches. This type of selectivity is a very serious problem associated with the conventional CMP process. Beginning with an average roughness of 30.4 Å Ra, and a peak-to-valley roughness of 378 Å PV, four cycles of the conventional CMP process actually degrade the average roughness of the wafer surface to 42.7 Å Ra, and the peak-to-valley roughness to 481 Å Pv.

Figure 3:
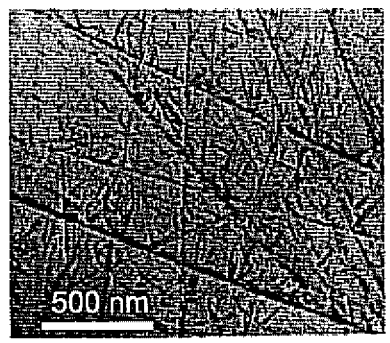
FIG. 3 is a TEM image of a wafer surface polished using a conventional CMP technique.
Figure 4:
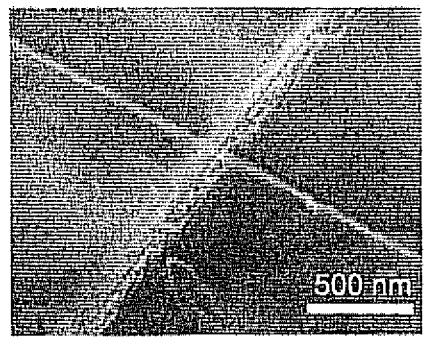
FIG. 4 is a TEM image of a wafer surface polished using one embodiment of the invention.

FIG. 3 is a TEM image of the surface of a typical, commercially available wafer. Here, the scratch density is about $7.5 \times 10^4/cm^2$, linear dislocation density is about $17.5 \times 10^4/cm^2$, dislocation density at the subsurface is about $1.3 \times 10^{10}/cm^2$, and the longest dislocation length is about 325 nm. By way of comparison, FIG. 4 is a TEM image of a similar wafer surface after polishing using the improved polishing process according to one embodiment of the invention. Here, the scratch density is about $3.5*10^4/cm^2$, linear dislocation density is about $12.5 \times 10^4/cm^2$ dislocation density at the subsurface is about $4.4 \times 10^7/cm^2$, and the longest dislocation length observed is about 300 nm.

Figure 5A:
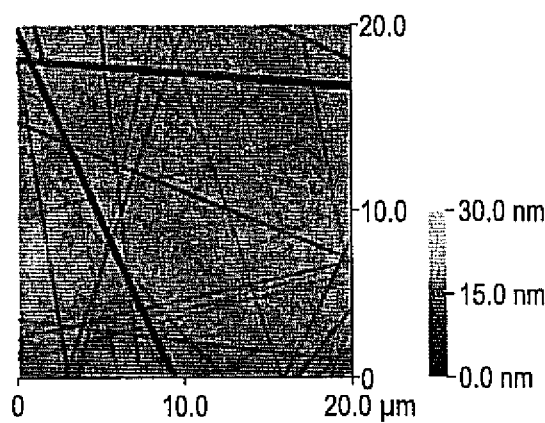
FIGS. 5A and 5B are comparative AFM images, FIG. 5A showing a conventionally polished wafer surface and FIG. 5B showing a wafer surface polished using one embodiment of the invention.
Figure 5B:
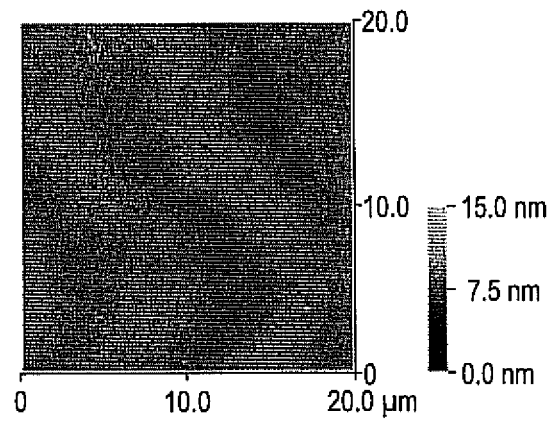

FIGS. 5A and 5B are AFM images respectively illustrating polished SiC wafer surfaces. FIG. 5A shows the surface of a typical, commercially available SiC wafer after conventional CMP polishing. This surface is characterized by an average roughness of 1.8 nm Ra, and a root mean square roughness of 2.8 nm Rq. However, FIG. 5B shows the surface of a similar SiC wafer after polishing with the improved polishing process according to one embodiment of the invention. In contrast to the results shown in FIG. 5A, the wafer surface shown in FIG. 5B is characterized by an average roughness of 0.3 nm Ra, and a root mean square roughness of 0.4 nm Rq.

Figure 6A:
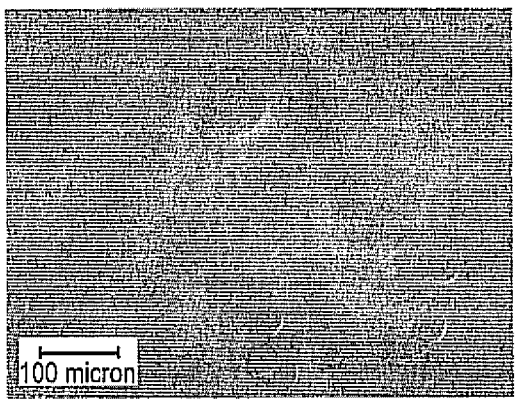
FIGS. 6A and 6B are optical micrographs of epitaxial gallium nitride (GaN) layers respectively grown on a conventionally polished wafer surface and a wafer surface polished using one embodiment of the invention.
Figure 6B:
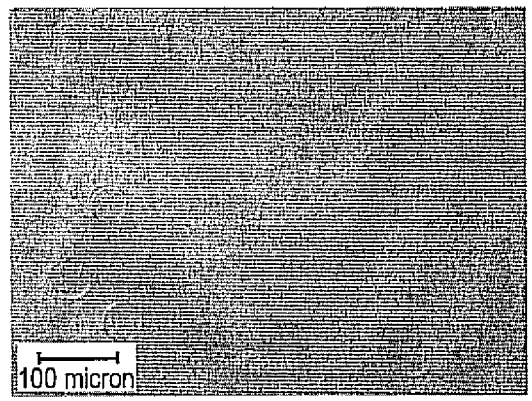

FIGS. 6A and 6B are optical micrographs showing epitaxial gallium nitride layers grown on polished SiC wafers. (Of note, the circular features visible in these micrographs are actually growth induced hillocks not subsurface damage).

FIG. 6A shows the surface of a GaN layer grown on a typical, commercially available wafer having an average roughness of about 7.2 nm Ra and a root mean square roughness of about 8.4 nm Rq. In contrast, FIG. 6B shows the surface of a GaN layer grown on a similar wafer after polishing with the improved polishing process according to one embodiment of the invention, and having an average roughness of about 4.3 nm Ra and a root mean square roughness of about 5.2 nm Rq.

Figures 7A, 7B:
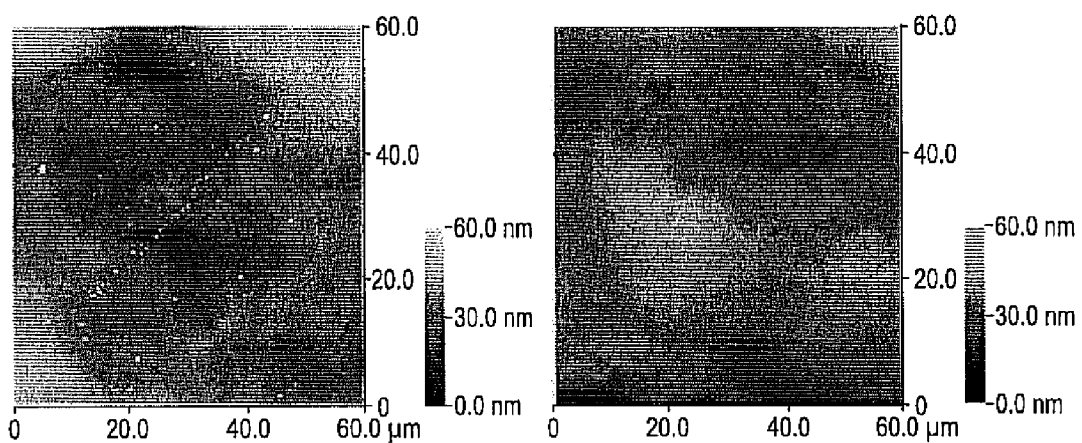
FIGS. 7A through 7E are AFM images further illustrating the qualitative difference between GaN layers grown on a conventional polished wafer surface and a wafer surface polished using one embodiment of the invention.

FIGS. 7A though 7E are also AFM images showing the quality of epitaxial GaN layers grown on polished SiC substrates. FIG. 7A shows an AFM image of an epitaxial GaN layer grown on a conventionally polished wafer. Here, Ra is about 7.2 nm, and Rq is about 8.4 nm. FIG. 7B shows an AFM image of an epitaxial GaN layer grown on a SiC substrate polished using the improved polishing process. Here, Ra is about 4.3 nm, and Rq is about 5.2 nm. Since the surface roughness of an epitaxial GaN layer grown on SiC substrate polished using the improved polishing process is considerably less than the surface roughness of a similar layer grown on a conventional substrate, semiconductor devices subsequently formed on the GaN layer will enjoy advantageous performance properties and reduced defect densities.

Figures 7C, 7D, 7E:
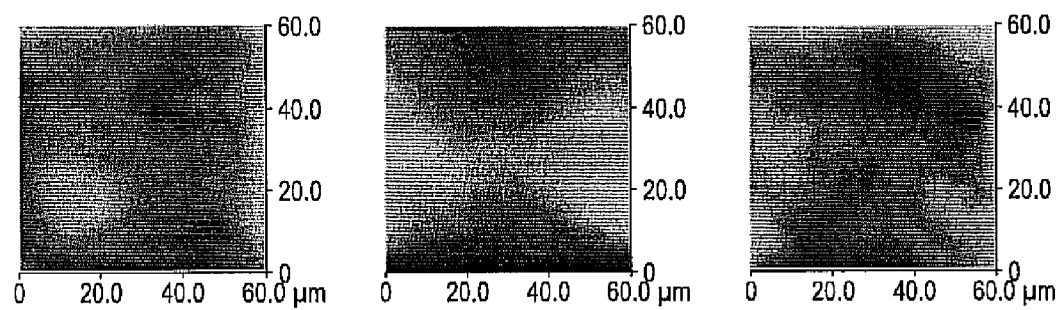

FIGS. 7C though 7E are AFM images of GaN epilayers grown on SiC substrates polished using the improved polishing process according to one embodiment of the invention. Each of the respective GaN epilayers has a thickness of about 1 micron, but the respective AFM images shown SiC substrates with varying thicknesses of material removed prior to the formation of the GaN epilayer. For example, FIG. 7C shows a SiC wafer having 60 nm of material removed by the improved polishing process. The average roughness of the subsequently formed GaN epilayer is about 3.4 nm Ra. By way of comparison, FIGS. 7D and 7E show respective SiC wafers having 250 nm and 1000 nm of material removed by the improved polishing process. The average roughness of the subsequently formed GaN epilayers is respectively about 1.2 nm Ra and 2.1 nm Ra. All of the SiC wafers shown in FIGS. 7A through 7E were selected from the same growth run of a 4H—SiC on-axis material.

Figure 8:
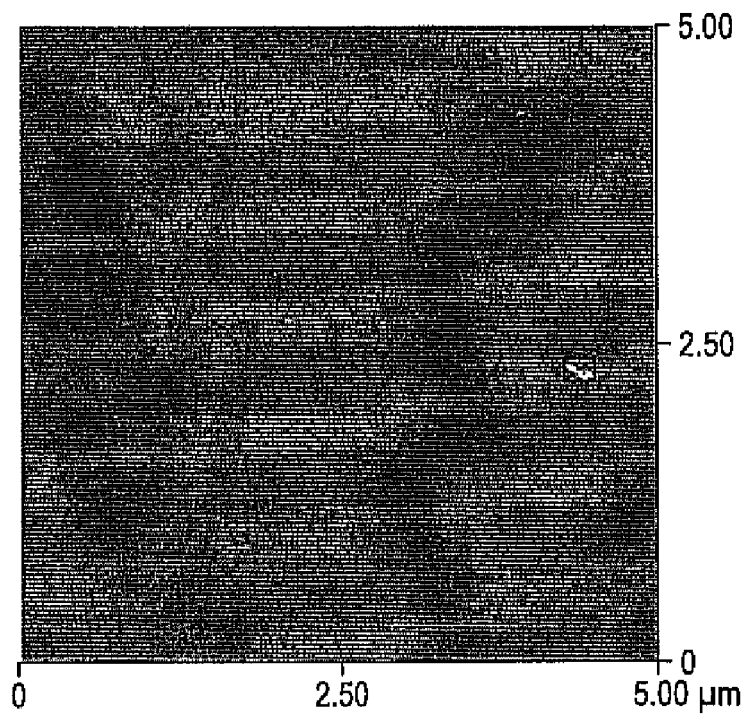
FIG. 8 is an AFM image of a wafer surface after polishing using one embodiment of the invention.

FIG. 8 is an AFM image showing a 5 μm×5 μm area near the center of a 4H—SiC wafer (80 off-axis) following surface treatment using the improved polishing process according to one embodiment of the invention. The wafer surface is very smooth having a low root-mean-square roughness value of about 0.16 nm Rq.

Figure 9:
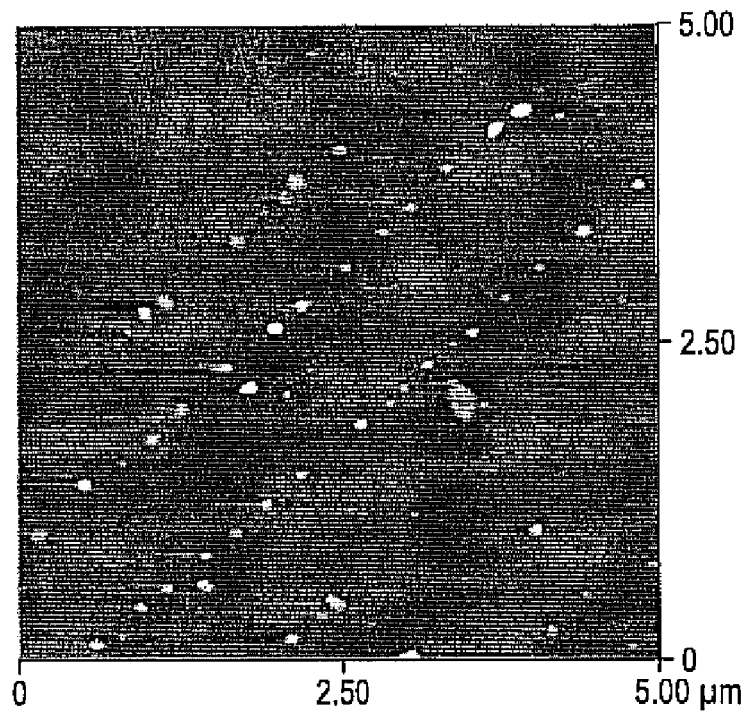
FIG. 9 is another AFM image of a wafer surface after conventional polishing.

In similar vein, FIG. 9 is an AFM image showing 5 μm×5 μm area near the center of a 6H—SiC wafer (on-axis). The wafer surface is also smooth having a root-mean-square roughness value of about 0.73 nm Rq.

Figure 10A:
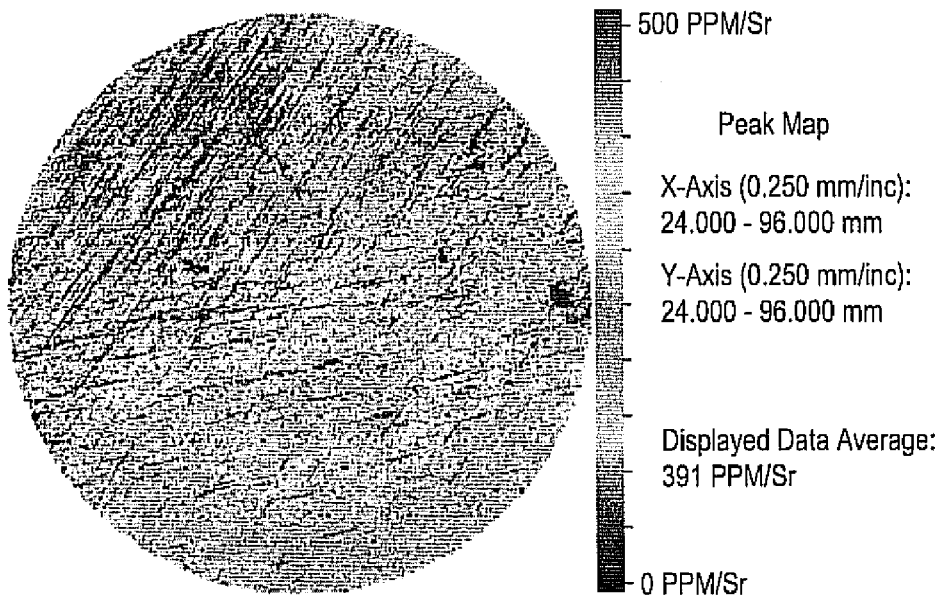
FIGS. 10A and 10B are PBS measurement images comparatively illustrating the subsurface damage for a conventionally polished wafer surface and a wafer surface polished using one embodiment of the invention.
Figure 10B:
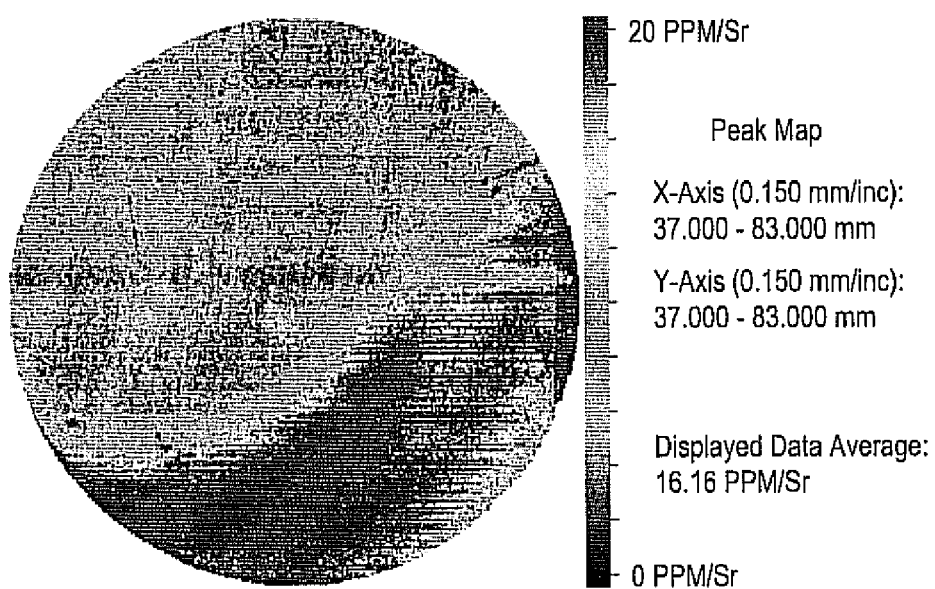

FIGS. 10A and 10B are images corresponding to PBS measurements of subsurface damage for respective SiC wafers. The PBS measurements were made using a probe beam developed from a 15 mW HeCd laser having an operational wavelength of 325 nm formed within a 0.4 mm diameter spot on the surface of the test sample wafers. FIG. 10A shows the subsurface damage observed in a 4H—SiC wafer as received from a commercial vendor (i.e., prior to application of the improved polishing process). Some streakiness is observed in this image having an average scatter of 391 ppm/sr. FIG. 10B shows the subsurface damage observed on a 4H—SiC wafer following surface treatment using the improved polishing process. The wafer surface after polishing with the improved polishing process exhibited a significantly lower average scatter of 16 ppm/sr, but there is some non-uniformity across the wafer surface. In particular, the scatter is low across about two-thirds of the wafer but is relatively higher across the remaining third. Yet, even the relatively higher scatter levels are far lower than seen from the conventionally provided wafer.

Figure 11:
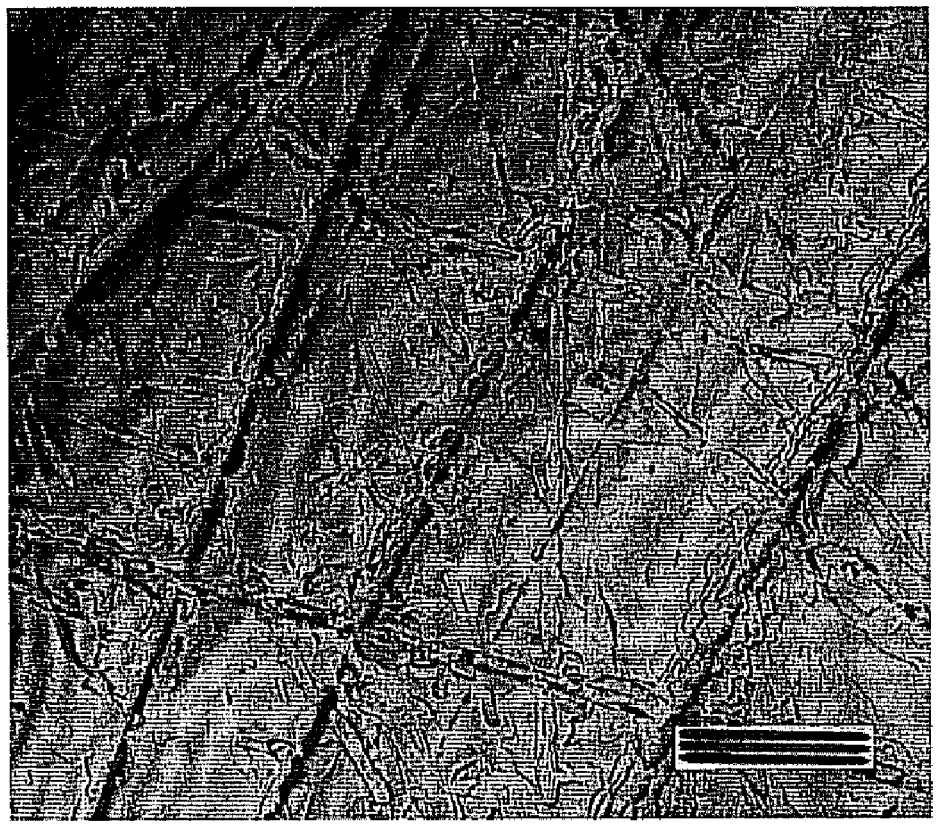
FIG. 11 is a TEM image illustrating a conventionally polished wafer surface.

FIG. 11 is a TEM image showing a substrate prepared using a conventional polishing process. The errantly selective nature of this process removes only heavily damaged portions of the wafer surface in close proximity of scratches. Many longer dislocation loops remain. Thus, while there is reduced overall surface damage, there is also increased surface roughness. Note that the scale bar provided with the FIG. 11 is 500 nm.

Figure 12:
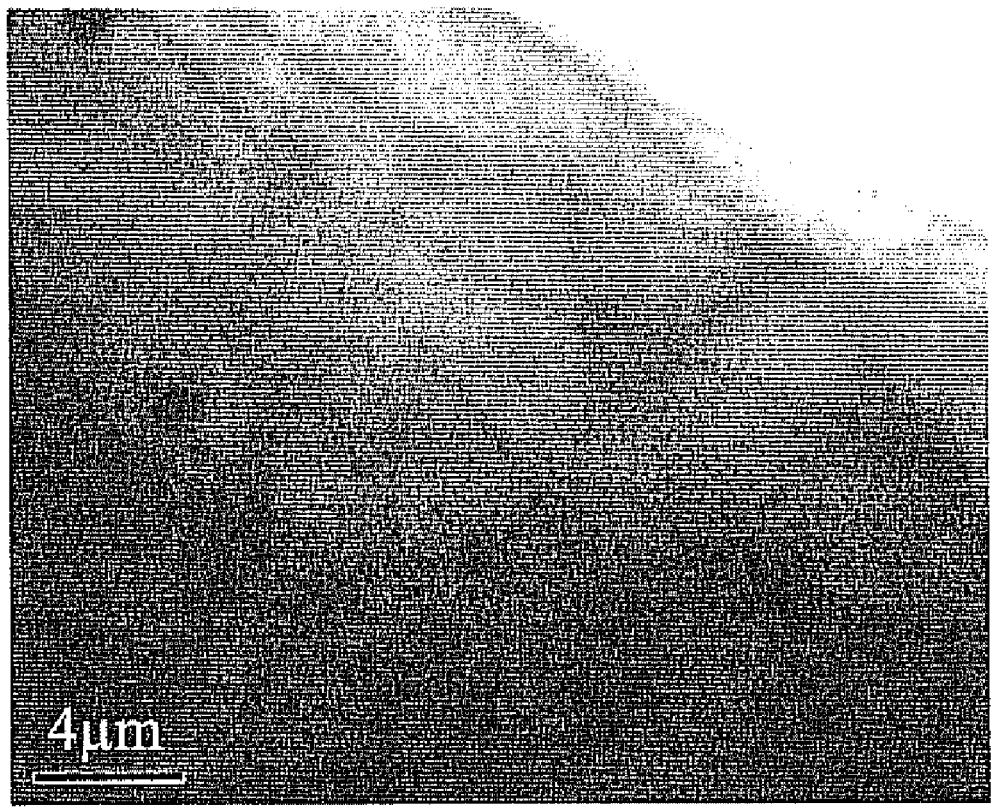
FIG. 12 is a TEM image illustrating a wafer surface polished using one embodiment of the invention.

FIG. 12 shows another substrate after polishing using the improved polishing process according to one embodiment of the invention. This embodiment first applies a conventional CMP process using 0.25 micron diamond grit. Thereafter, the wafer surface was polished through four (4) hours of one embodiment of the improved polishing process using a polishing mixture comprising; 180 ml of 200 A alumina, 180 ml of de-ionized water, and 40 ml of 30% hydrogen peroxide. FIG. 12 is a plan view TEM image, with contrast due to TEM sample thickness changes, showing no defects in the field of view. Higher uniform removal rates leave no intrinsic damage detectable by TEM. There are no visible dislocations, and surface roughness is improved.

Of further note, the improved polishing process according to one or more embodiments of the invention may be used to reclaim (e.g., re-surface) wafers having defective epitaxial layers. The improved polishing process may also be applied to re-polish wafers having an undesirable surface finish. The improved polishing process may also be used as a replacement for one or more steps in a conventional CMP process. Variably sized abrasive (e.g., alumina) particles may be used between cycles of the improved polishing process.

Any of these possible applications may be made to 6H— or 4H—SiC, conductive or semi-insulating, as well as on axis or off-axis wafer types. The improved polishing process may be applied to a carbon-faced SiC wafer, a silicon-faced SiC wafer or a non-polar SiC wafer. (A non-polar SiC wafer is a wafer that does not terminate in either a carbon face or a silicon and may be obtained, for example, by slicing a SiC boule in a direction non-perpendicular to its vertical growth axis).

In many of the foregoing embodiments, alumina is used as an abrasive within the polishing mixture. Indeed, alumina has proven to be very effective in many applications. Yet, other abrasives may be used, alternatively or in combination with alumina, and still other abrasives or combination of abrasives may well prove more effective in certain applications of the invention. The various polishing mixtures consistent with the dictates of the invention may, optionally, comprise additives that reduce aggregation of the constituent abrasive particles.

Other abrasives adapted for use in various embodiments of the invention may include; oxides—such as alumina, other metal oxide, zirconia, silica, etc.—, diamond, carbides, nitrides (such as boron nitride), and other inorganic materials. Selected illustrative abrasive examples include 2 μm zirconia, 1 μm and 0.1 μm alumina, and 0.1 μm and 0.05 μm diamond. Oxide abrasives may include silicates, such as metal silicates. Other possible abrasives include mineral-derived abrasives.

Abrasives may be included in a polishing mixture consistent with the improved polishing process in particles form. The size (e.g., diameter or other size parameter) of the abrasive particles may vary from between nano-sized (e.g. 50 to 999 nm) to micron-sized (e.g. 1 to 10 microns), or even greater.

Use of an appropriately selected polishing mixture in accordance with one or more embodiments of the invention may allow elimination of the use of diamond and/or colloidal silica from another conventional polishing process applied to the surface treatment of a wafer Additionally, oxidizers may be added to increase the rate of material removal, for example, during the early polishing cycles of a multiple-cycle, improved polishing process.

The abrasive selected for use in the improved polishing process may have oxidizer properties and may, therefore, function as both an oxidizer and abrasive within the polishing mixture.

Various oxidizers may be used to improve the performance of the improved polishing mixture consistent with one or more embodiments of the invention. Exemplary oxidizers include: ozone-treated (i.e., ozonated) water, colloidal silica, hypochlorite (such as sodium hypochlorite), and peroxide (such as hydrogen peroxide), sulfates, phosphates, carbonates, percarbonates, other oxides, etc. A selected oxidizer may also have certain abrasive qualities and may, therefore, function as both an oxidizer and abrasive.

The foregoing embodiments of the invention provide a substantially damage-free wafer surface adapted for use as a substrate. Such substrates may be obtained at working temperatures well below those proposed for conventional CMP processes. For example, embodiments of the improved polishing process may be run at temperatures ranging from room temperature up to 100° C.

Substrates provided by the improved polishing process will find many practical applications within semiconductor devices. That is, active semiconductor devices formed on such substrates will exhibit improved device reliability and higher device yields at lower fabrication costs. Polishing induced dislocation densities will be significantly reduced over conventional substrates, in some cases being reduced by about three orders of magnitude. Such defect densities approach native defect densities present in the constituent material forming the substrate. Hence, the quality of wafer surface polishing will no longer be a potentially limiting factor in semiconductor device performance.

Embodiments of the invention are well suited to the polishing of boule-grown SiC and epitaxially formed SiC. Embodiments of the invention are also well suited to the polishing of other materials adapted for use as a substrate. These other materials include, for example, conductive, semiconductor, wide-bandgap semiconductor, semi-insulating, and insulating types of materials, as well as combination thereof Thus, devices and layers susceptible to successful formation on any one of the foregoing substrate types, as polished by the improved polishing process according to one or more embodiments of the invention, include; active semiconductor, including nitride semiconductor (such as GaN, AlN, AlGaN, etc.), other semiconductor layers and devices (such as arsenide, e.g., GaAs), phosphlide (such as InP, GaP), oxides (such as $SnO_2$), and/or ternary semiconductor (such as AlGaN for all $Al_xGa_{1-x}N$, where x is between 0 and 1).

Devices having improved performance characteristics may be formed on a thin film of aluminum nitride, gallium nitride, or silicon carbide, as formed on a substrate polished using the improved polishing process. That is, polished substrates provided by embodiments of the invention are particularly well adapted to support the subsequent growth of epitaxial films. In turn, these epitaxial films support the formation of active layers and/or devices, because the damage resulting from the fabrication and polishing of the constituent wafer surface that so regularly degrades the performance of devices formed on conventionally prepared substrates simply does not exist in a substrate polished using the improved polishing process.

Substrates formed from a wafer having a surface polished using the improved polishing process according to one or more embodiments of the invention may be used to support other devices such as reflectors, interferometric devices—such as antireflection films, windows, filters, Rf devices, IR devices, optical devices, UV devices, or X-ray devices, and other apparatus requiring a polished surface, e.g., computer disks or disk drives.

Similarly, the improved polishing process provides improved substrates adapted to support High Electron Mobility Transistors, e.g., AlGaN/GaN HEMT, since improvements may be realized in the transport properties, including uniformity, and RF performance of such devices. Other exemplary devices supported by the improved substrates provided by embodiments of the invention include lasers, other light emitting devices such as light emitting diodes (LEDs)—where the term "light" generally denotes electromagnetic radiation in the infrared, visible, and ultraviolet spectral ranges, radar devices, low-loss power switching devices and systems, cryogenic devices (such as nitride-based cryogenic electronic devices), transistors, amplifiers (such as low noise amplifiers), integrated circuits, and devices adapted for use in electric vehicles. Some devices and/or layers formed on substrates polished using the improved polishing process are particularly well suited for use in hostile environments like space.

As evidenced from the foregoing example, the improved polishing process provided by one or more embodiments of the invention is non-selective relative to scratches and other wafer surface defects. As a result, scratches and other surface defects are polished out of the working surface of a wafer, instead of being polish-propagated down through the working surface as is common with conventional CMP processes. Additionally, the improved polishing process prevents and/or removes subsurface damage from a wafer being polished. Nonetheless, the improved polishing process is also characterized in many embodiments by a rate of material removal equal to or greater than that produced by conventional polishing processes. The dislocation density (e.g., $10^6$ cm$^{-2}$ dislocations or less) introduced by the improved polishing process is approximately equal to the dislocation density reported for high quality GaN and SiC layers. Thus, where a SiC substrate is polished using the improved polishing process, the quality of a subsequently formed epitaxial layer, such as a GaN layer, will not be limited by the surface finish of the SiC substrate.

The improved polishing process may be used exclusively within the surface treatment of a wafer surface, or it may be used as one (e.g., a final) or more process components in a surface treatment potentially comprising a conventional mechanical, CMP, and/or etching process(es). However, used in the overall process of treating a material surface (e.g., a substrate), the improved polishing process allows lower cost devices to be fabricated with higher yield and fewer defects. Since the improved polishing process provides repeatable surface roughness, a high rate of material removal with low resulting damage, and reduced subsurface damage, consistent substrate finishing may be achieved and accounted for in the design of epitaxial layers and/or devices subsequently formed on the substrate. This consistent, controllable substrate finishing further allows the improved polishing process to be applied effectively to both wafer surfaces and an epitaxial layer grown on a wafer surface. The polished surfaces provided by the improved polishing process may be planar, or in some examples, curved in nature.

The invention is not restricted to the examples and embodiments described above. Such teaching examples are not intended as limitations on the scope of the invention. Processes, apparatus, compositions, and the like described herein are exemplary and not intended as limitations on the scope of the invention. Changes therein and other uses will occur to those skilled in the art. The scope of the invention is defined by the following claims.

The invention claimed is:

1. A chemical mechanical polishing process for treating a boule grown or epitaxial silicon carbide (SiC) surface, comprising:
    providing a polishing mixture comprising an abrasive, said abrasive comprising a mixture of corundum and boehmite particulate, and an oxidizer mixed in a solution having a pH less than or equal to 5 wherein said abrasive has a hardness less than that of the surface and said abrasive is present in an amount of greater than 33 volume percent of said solution;
    subjecting the surface to said polishing mixture; and
    maintaining the subjecting step until final roughness average of the surface is less than 3 Angstroms and at material removal rate at least 200 nanometer per hour from the surface.

2. The process of claim 1 wherein said oxidizer is selected from the group consisting of ozonated water, colloidal silica, hypochlorite, hydrogen peroxide, sulfate, phosphate, carbonate, percarbonate, and an oxide.

3. The process of claim 1 wherein said oxidizer is hydrogen peroxide.

4. The process of claim 1 wherein the maintaining step present is non-selective as to material removal from surface.

* * * * *